United States Patent
Nardi et al.

(10) Patent No.: US 9,990,576 B2
(45) Date of Patent: Jun. 5, 2018

(54) COMPONENT WITH INTERNAL SENSOR AND METHOD OF ADDITIVE MANUFACTURE

(71) Applicant: United Technologies Corporation, Farmington, CT (US)

(72) Inventors: Aaron T. Nardi, East Granby, CT (US); Joseph V. Mantese, Ellington, CT (US); Michael A. Klecka, Coventry, CT (US); Daniel V. Viens, Mansfield Center, CT (US)

(73) Assignee: United Technologies Corporation, Farmington, CT (US)

(*) Notice: Subject to any disclaimer, the term of this patent is extended or adjusted under 35 U.S.C. 154(b) by 0 days. days.

(21) Appl. No.: 15/106,529

(22) PCT Filed: Jan. 23, 2015

(86) PCT No.: PCT/US2015/012677
§ 371 (c)(1),
(2) Date: Jun. 20, 2016

(87) PCT Pub. No.: WO2015/112858
PCT Pub. Date: Jul. 30, 2015

(65) Prior Publication Data
US 2017/0286821 A1    Oct. 5, 2017

Related U.S. Application Data

(60) Provisional application No. 61/931,293, filed on Jan. 24, 2014.

(51) Int. Cl.
*G06K 19/077* (2006.01)
*G01D 11/24* (2006.01)

(52) U.S. Cl.
CPC ..... *G06K 19/07722* (2013.01); *G01D 11/245* (2013.01)

(58) Field of Classification Search
None
See application file for complete search history.

(56) References Cited

U.S. PATENT DOCUMENTS

| | | |
|---|---|---|
| 6,519,500 B1 | 2/2003 | White |
| 2003/0148610 A1 | 8/2003 | Igel et al. |
| 2005/0033819 A1* | 2/2005 | Gambino ............... G01D 5/243 709/213 |
| 2006/0169902 A1 | 8/2006 | Watanabe |
| 2007/0040702 A1* | 2/2007 | Mosher .................... B64G 1/10 340/943 |
| 2007/0177362 A1 | 8/2007 | Fortson |
| 2009/0261287 A1 | 10/2009 | Withey et al. |
| 2012/0132930 A1 | 5/2012 | Young et al. |
| 2012/0160031 A1 | 6/2012 | Van Steenberge et al. |

OTHER PUBLICATIONS

Extended EP Search Report dated Jan. 23, 2017.

* cited by examiner

*Primary Examiner* — Kristy A Haupt
(74) *Attorney, Agent, or Firm* — O'Shea Getz P.C.

(57) ABSTRACT

A component may be self-monitoring having a sensor assembly located on a surface of a substrate and covered by an encapsulating layer additively manufactured over the sensor assembly and thereby bonded to the substrate. The sensor may be wireless, self-powered, and embedded into the substrate such that it is unobtrusive and may not limit the performance or function of the component.

20 Claims, 3 Drawing Sheets

COMPONENT WITH INTERNAL SENSOR AND METHOD OF ADDITIVE MANUFACTURE

CROSS-REFERENCE TO RELATED APPLICATION

This application claims priority to PCT Patent Application No. PCT/US2015/012677 filed Jan. 23, 2015, which claims priority to U.S. Provisional Application No. 61/931,293 filed Jan. 24, 2014, which are hereby incorporated herein by reference in their entireties.

BACKGROUND

The present disclosure relates to a component and more particularly to a monitored component having an internal sensor and method of additive manufacture.

The use of monitoring equipment and related sensors attached to operating components of, for example, machinery enables added safety benefits and the gathering of performance data often not feasible through external observation. Knowledge of such performance data can be used to enhance machinery efficiency and prevent or predict machinery downtime for maintenance. Current sensors are often hardwired to data collection devices thus limiting component applications due to complications of locating the wiring and the operating movement of the component.

Known wireless sensors may resolve some of these complications; however, and especially when embedding the sensors into the component, known machining and bonding techniques of sensor covers onto the component may create a host of mechanical (e.g. vibration) and chemical (e.g. moisture and corrosion) problems with the component that would not otherwise exist if an embedded sensor was not applied to the component.

SUMMARY

A component according to one, non-limiting, embodiment of the present disclosure includes a substrate carrying a surface, a sensor assembly disposed on the surface, and an additive manufactured layer disposed over the sensor and secured to the substrate by additive manufacturing.

Additionally to the foregoing embodiment, the additive manufactured layer is a cold sprayed additive layer.

In the alternative or additionally thereto, in the foregoing embodiment the additive manufactured layer is an ultrasonic additive manufactured layer.

In the alternative or additionally thereto, in the foregoing embodiment the additive manufactured layer is a thermal sprayed additive layer.

In the alternative or additionally thereto, in the foregoing embodiment an EM reflector of the sensor assembly is located between the surface and an RF sensor of the sensor assembly.

In the alternative or additionally thereto, in the foregoing embodiment, the component includes a protective cover disposed over the sensor assembly and beneath the additive manufacture layer.

In the alternative or additionally thereto, in the foregoing embodiment the sensor assembly is wireless.

In the alternative or additionally thereto, in the foregoing embodiment the additive manufactured layer is additive manufactured on the protective cover and the substrate.

In the alternative or additionally thereto, in the foregoing embodiment a pocket in the substrate has a bottom defined by the surface, and the sensor assembly is in the pocket.

In the alternative or additionally thereto, in the foregoing embodiment a pocket in the substrate has a bottom defined by the surface, and the sensor assembly is in the pocket.

In the alternative or additionally thereto, in the foregoing embodiment the additive manufactured layer is a coating covering a substantial portion of the substrate.

In the alternative or additionally thereto, in the foregoing embodiment the sensor assembly measures at least one of temperature, motion, strain, and macro-displacement.

In the alternative or additionally thereto, in the foregoing embodiment the sensor assembly has an embedded power device for energizing the sensor.

In the alternative or additionally thereto, in the foregoing embodiment the sensor assembly is an RFID.

In the alternative or additionally thereto, in the foregoing embodiment the sensor assembly is completely embedded.

A method of manufacturing a component according to another, non-limiting, embodiment includes the steps of placing a sensor assembly on a substrate of the component, and additive manufacturing a layer over the sensor and onto the substrate.

Additionally to the foregoing embodiment, the additive manufacturing step is a cold spray process.

In the alternative or additionally thereto, in the foregoing embodiment the additive manufacturing step is an ultrasonic additive manufacturing process.

In the alternative or additionally thereto, in the foregoing embodiment, the method includes the further step of placing a protective cover over the sensor assembly before the additive manufacturing step.

In the alternative or additionally thereto, in the foregoing embodiment, the method includes the further step of encapsulating a sensor of the sensor assembly in an encapsulation of the sensor assembly before the additive manufacturing step.

The foregoing features and elements may be combined in various combinations without exclusivity, unless expressly indicated otherwise. These features and elements as well as the operation thereof will become more apparent in-light of the following description and the accompanying drawings. It should be understood; however, that the following description and figures are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
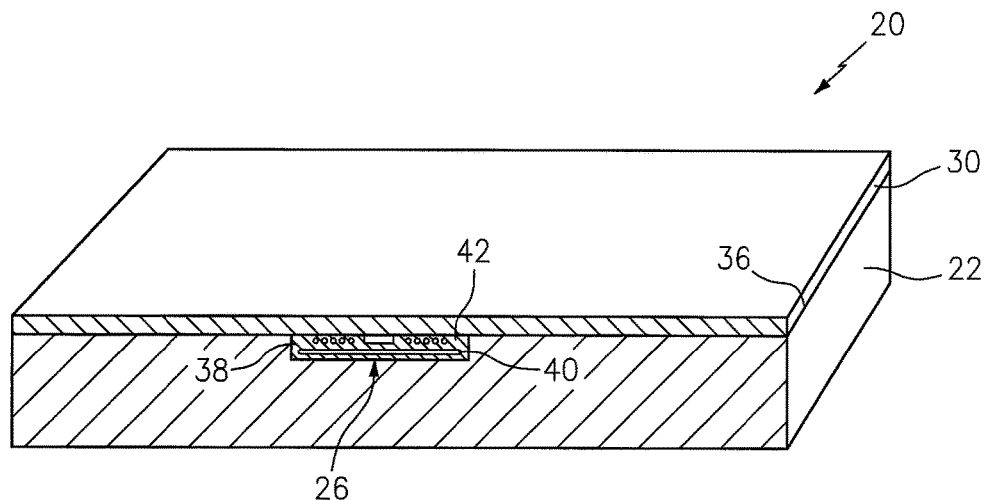
FIG. 1 is a cross section of a component in accordance with a non-limiting embodiment of the present disclosure.
Figure 2:
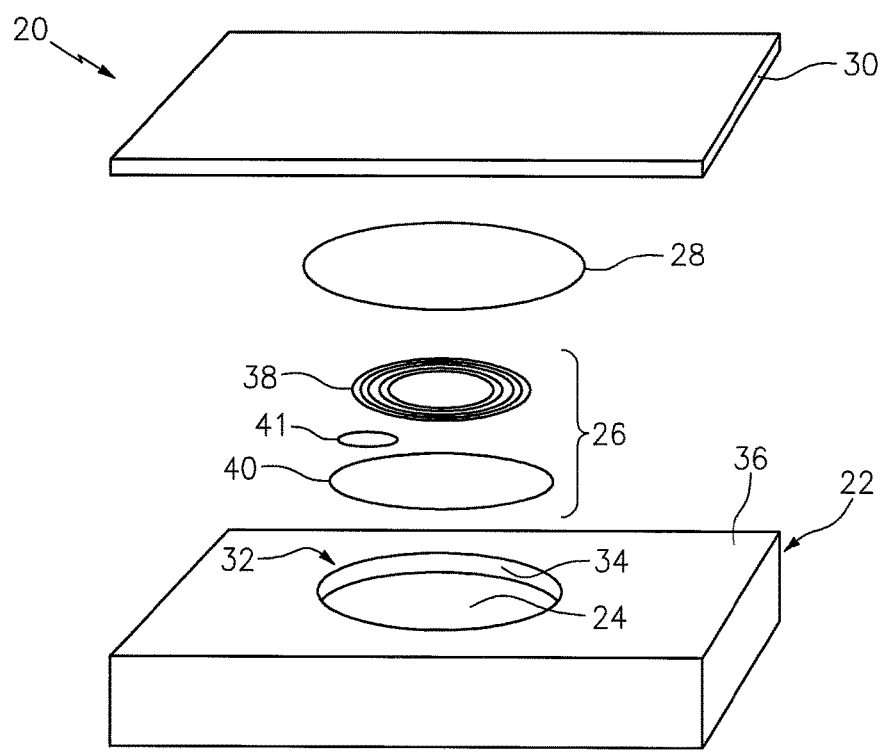
FIG. 2 is an exploded perspective view of the component.

FIGS. 1 and 2 illustrate a component 20 that may be self-monitoring and manufactured at least in-part by an additive manufacturing process. The component 20 has a substrate 22, a surface 24 carried by the substrate, a sensor assembly 26 placed upon the surface 24, a protective cover 28 placed over the sensor assembly, and an encapsulating layer 30 manufactured by an additive manufacturing process. The protective cover 28 may be manufactured separate from the layer 30 and may be bonded to the substrate 22 through any variety of technics depending in-part on material compositions chosen for the substrate and cover. The cover 28 may be manufactured through (for example) a casting, machining and/or additive manufacturing process. It is further contemplated and understood that the cover 28 may be additive manufactured in unison with the additive manufacturing of the encapsulating layer 30.

The substrate 22 may further have a pocket 32 defined by side walls 34 and the surface 24 as a bottom surface. The pocket 32 communicates through an outer surface 36 carried by the substrate for receipt of the sensor assembly 26 and the protective cover 28. It is further contemplated and understood that the sensor assembly 26 may not be located in a pocket as such, and depending upon component geometry and constraints, may be placed upon the outer surface 36 and encapsulated or embedded by the layer 30 as a covering. Further, it is understood that the substrate 22 may be (for example) cast, machined or manufactured by a separate additive manufacturing process and the pocket 32 may either be machined into the substrate as a separate step or formed during the manufacturing process of the substrate.

The sensor assembly 26 may be wireless with no interconnects and self-powering, and may have a radio frequency (RF) sensor 38 and an electro-magnetic (EM) reflector 40 for increasing signal strength and readability. The assembly 26 may be completely embedded into the component 20 by at least the layer 30 such that no wires or communication attributes of the sensor protrude through the layer 30. The assembly 26 may also have an encapsulation 42 made of a suitable potting material such as, for example, an epoxy or ceramic. The encapsulation 42 encapsulates the sensor 38 and reflector 40 and serves to protect the sensor from mechanical and environmental concerns like, for example, moisture. The encapsulation may additionally protect the sensor and reflector from damage during subsequent additive manufacturing. It is understood and contemplated that the encapsulation 42 may be applied prior to placing the assembly 26 in the pocket 32 or the encapsulation may be poured into the pocket in liquid form after or during placement of the sensor and reflector into the pocket. If the later, the encapsulation may solidify and thereby adhere to the sidewalls 34 and bottom surface 24 of the substrate 22 thereby securing the assembly 26 firmly in place. The sensor assembly 26 may include an embedded power device 41. This device may be a battery or a power harvesting device. Power harvesting devices include thermal or pyro electric devices, and kinetic based devices that may provide power through the motion and/or vibration of the component.

Furthermore, and depending on the protective properties of the encapsulation 42, the protective cover 28 may not be needed and the layer 30 can be additive manufactured directly over the encapsulation 42. For example the encapsulation material having been poured into the pocket containing the sensor and reflector may contain sufficient metal content near the top surface that the surface is electrically conductive. A metal cover material may then be produced through localized electrodeposition from a suitable chemical solution. Another example may be a thermoplastic encapsulation with temperature capability and erosion resistance for an additive process such as Cold Spray or Thermal Spray to create a high strength bond. Materials that may function as both an encapsulation and a protective cover may include alumina, silicon oxide, ferrite, and polymers. The sensor assembly 26 may be any variety and combination of sensor types and may function to detect temperature, motion, macro-displacement and/or strain to name only a few examples, with the understanding that 'macro-displacement' refers to the displacement of component 20 through component motion; and, internal stress can generally be calculated from the strain readings. The RF sensor 38 may be a passive RFID sensor for identification purposes of the component.

Figure 3:
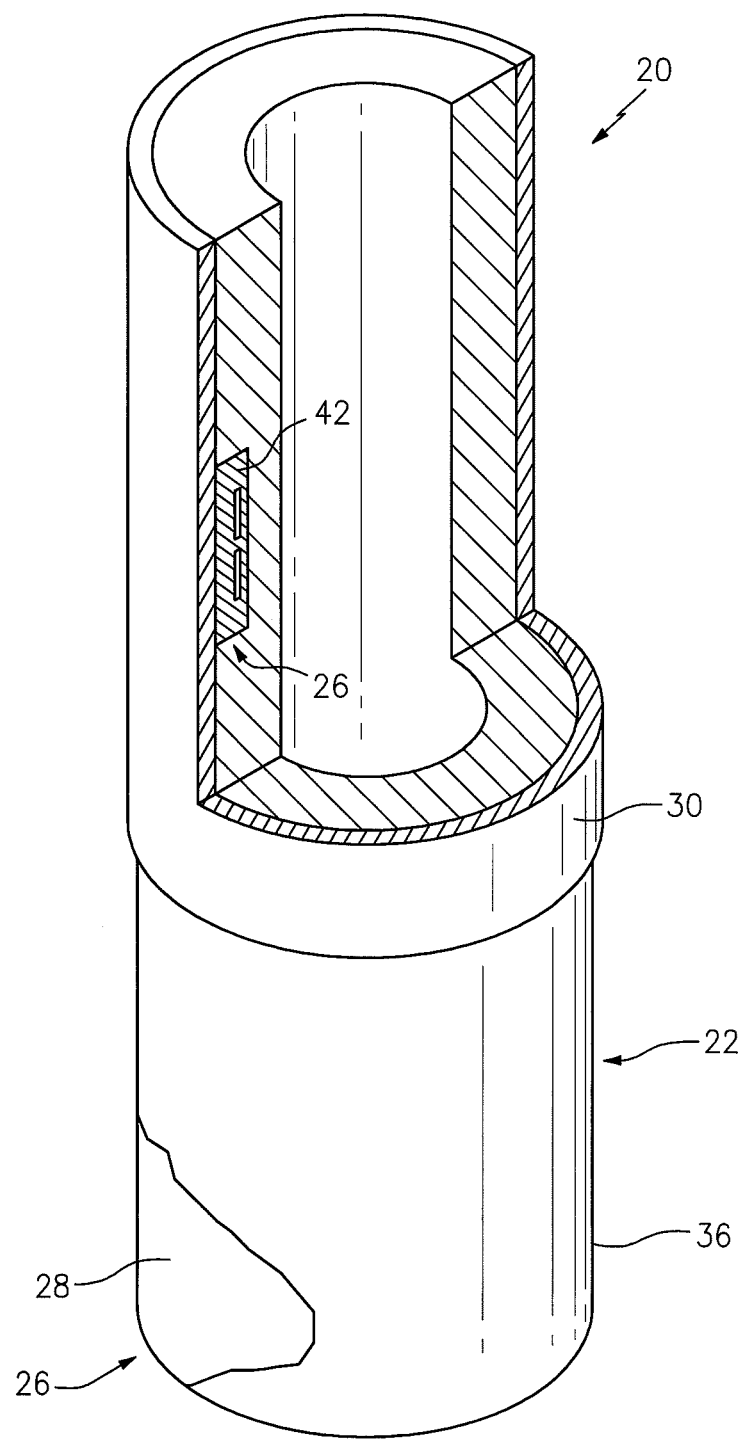
FIG. 3 is a perspective view of the component with a section cut away to show internal detail.
Figure 4:
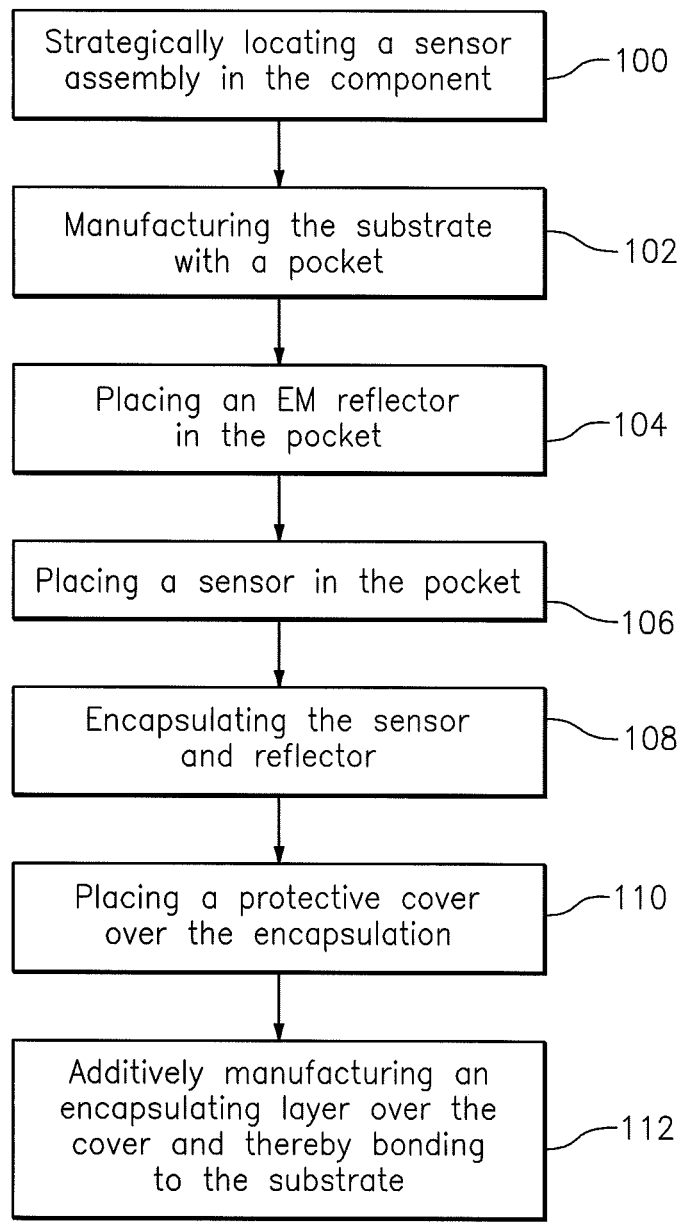
FIG. 4 is a flow chart of a method of manufacturing the component.

Referring to FIG. 3, the component 20 is illustrated as a tube-like structure having two axially spaced sensor assemblies 26. The first assembly 26 is shown in cross section and the encapsulating layer 30 is metallic and completely surrounds the tube-like substrate 22. The second assembly 26 is not yet covered with a layer 30, thus the protective cover 28 is exposed. In this example, the cover 28 is a thin metal sheet tac-welded directly to the substrate.

The substrate 22, the protective cover 28 and the encapsulating layer 30 may be made of any combination of metal alloys, ceramics and/or composite materials. The substrate 22 material will generally be dependent upon the application or use of the component. The layer 30 material may be dependent upon the physics and operating parameters of the sensor (e.g. magnetic field penetration); the type of additive manufacturing process desired and temperatures generated during the process; and mating or joining characteristics to the substrate material. For example, the substrate 22 may be made of a Ni-base alloy, the protective cover 28 made of the same Ni-base alloy that is welded to the substrate, and the encapsulating layer 30 may be a heat resistant ceramic that also functions to protect the substrate from elevated temperatures during operation of the component 20. As another example, the substrate 22 may be made of an aluminum alloy and the layer 30 may be made of a Ni alloy or stainless steel, both possessing good adherence traits to the aluminum alloy and have good magnetic field penetration properties. Generally, the materials used may have low electrical conductivity and/or low dielectric or magnetic losses along with low magnetic permeability.

As previously indicated, at least the encapsulating layer 30 is manufactured using an additive manufacturing process. The known additive manufacturing processes can generally be divided by those that produce high heat and processes that do not. Additive manufacturing processes generally known in the art and that must produce melting temperature heat include, for example, Additive Layer Manufacturing (ALM) devices, such as Direct Metal Laser Sintering (DMLS), Selective Laser Melting (SLM), Laser Beam Melting (LBM) and Electron Beam Melting (EBM) that provide for the fabrication of complex metal, alloy, polymer, ceramic and composite structures by the freeform construction of the workpiece, layer-by-layer. The principle behind heated additive manufacturing processes involves the selective melting of atomized precursor powder beds by a directed energy source, producing the lithographic build-up of the workpiece. The melting of the powder occurs in a small localized region of the energy beam, producing small volumes of melting, called melt pools, followed by rapid solidification, allowing for very precise control of the solidification process in the layer-by-layer fabrication of the workpiece. These devices may be directed by three-dimensional geometry solid models developed in Computer Aided Design (CAD) software systems.

These heat producing additive manufacturing processes may all be applied toward the manufacturing of the substrate 22, but may be somewhat limited in use for manufacturing the encapsulating layer 30 especially if the layer 30 is made of a superalloy with high melting points. That is, the high temperatures needed to melt the powder material that will form the layer 30 and in some instances to also melt a melt back region of the substrate 22 (i.e. for adherence of the layer to the substrate) may damage the sensor assembly 26. Inversely, where melting temperatures of the layer 30 are low, additive manufacturing processes that apply such a low melting temperature heat are viable options.

Two examples of additive manufacturing processes that do not apply elevated melting temperature heat are generally known in the art as Cold Spray (CS) Additive Manufacturing and Ultrasonic Additive Manufacturing. Both techniques are able to manufacture and apply the encapsulating layer 30, regardless of melting temperatures, over the protective cover 28 and bond the layer 30 to at least the substrate 22. These cold processes are also advantageous when the substrate 22 has directional grain microstructures (e.g. single crystal for metal alloys) that should be preserved. CS Additive Manufacturing utilizes a compressed gas to accelerate a powder (e.g. metal powder) to supersonic speeds that are impinged upon the substrate 22 and the protective cover 28. The powder plastically deforms and thereby forms the layer 30 and creates the bonding interface with the substrate 22. It is further contemplated and understood that the additive layer may be composed of a composite with properties that may have low electrical conductivity, and/or low dielectric or magnetic losses, along with low magnetic permeability. The additive layer may be made of, for example, aluminum with silicon carbide, or nickel with silicon carbide Ultrasonic Additive Manufacturing (also known as Ultrasonic Consolidation), applies high-frequency ultrasonic vibrations that may be about 20,000 hertz to a metal foil material and holds this material against the substrate 22 until a solid-state weld is achieved. This process may apply a plurality of foil layers until the layer 30 with a desired thickness is achieved. CNC contour milling may then be applied to achieve the desired shape of the layer or component 20. Although Ultrasonic Additive Manufacturing does produce heat, temperatures typically will not exceed about fifty percent of the base material melting temperature.

A method of manufacturing the component 20 and as step 100 includes strategically determining a location in the component 20 for the sensor assembly 26 that will not degrade the component performance or integrity yet will provide the desired data. As step 102, the substrate is manufactured with a surface that may be in a pocket. As step 104, the EM reflector 40 the sensor assembly 26 is placed in the pocket 32, or alternatively may be deposited by additive manufacturing. As step 106, the sensor 38 of the assembly 26 is placed in the pocket 32 over the reflector 40. As step 108, the encapsulation 42 may be poured into the pocket 32 and therein solidifies. As step 110, the protective cover 28 may be placed over the encapsulation 42, and as step 112 the layer 30 is additively manufactured directly over the cover 28 and onto and bonded to an outer surface 36 of the substrate 22.

It is understood that relative positional terms such as "forward," "aft," "upper," "lower," "above," "below," and the like are with reference to the normal operational attitude and should not be considered otherwise limiting. It is also understood that like reference numerals identify corresponding or similar elements throughout the several drawings. It should be understood that although a particular component arrangement is disclosed in the illustrated embodiment, other arrangements will also benefit. Although particular step sequences may be shown, described, and claimed, it is understood that steps may be performed in any order, separated or combined unless otherwise indicated and will still benefit from the present disclosure.

The foregoing description is exemplary rather than defined by the limitations described. Various non-limiting embodiments are disclosed; however, one of ordinary skill in the art would recognize that various modifications and variations in light of the above teachings will fall within the scope of the appended claims. It is therefore understood that within the scope of the appended claims, the disclosure may be practiced other than as specifically described. For this reason, the appended claims should be studied to determine true scope and content.

What is claimed is:

1. A component comprising:
    a substrate carrying a surface;
    a sensor assembly disposed on the surface; and
    an additive manufactured layer disposed over the sensor and secured to the substrate by additive manufacturing,
    wherein an EM reflector of the sensor assembly is located between the surface and an RF sensor of the sensor assembly.

2. The component set forth in claim 1 wherein the additive manufactured layer is a cold sprayed additive layer.

3. The component set forth in claim 1 wherein the additive manufactured layer is an ultrasonic additive manufactured layer.

4. The component set forth in claim 1 wherein the additive manufactured layer is a thermal sprayed additive layer.

5. The component set forth in claim 1 further comprising:
    a protective cover disposed over the sensor assembly and beneath the additive manufacture layer.

6. The component set forth in claim 5 wherein the additive manufactured layer is additive manufactured on the protective cover and the substrate.

7. The component set forth in claim 5 wherein a pocket in the substrate has a bottom defined by the surface, and the sensor assembly is in the pocket.

8. The component set forth in claim 7 wherein the additive manufactured layer is a coating covering a substantial portion of the substrate.

9. The component set forth in claim 1 wherein the sensor assembly is wireless.

10. The component set forth in claim 1 wherein a pocket in the substrate has a bottom defined by the surface, and the sensor assembly is in the pocket.

11. The component set forth in claim 1 wherein the sensor assembly measures at least one of temperature, motion, strain, and macro-displacement.

12. The component set forth in claim 1 wherein the sensor assembly has an embedded power device for energizing the sensor.

13. The component set forth in claim 1 wherein the sensor assembly is an RFID.

14. The component set forth in claim 1 wherein the sensor assembly is completely embedded.

15. A method of manufacturing a component comprising the steps of:
    placing a sensor assembly on a surface of a substrate of the component; and
    additive manufacturing a layer over the sensor and onto the substrate,
    wherein an EM reflector of the sensor assembly is located between the surface and an RF sensor of the sensor assembly.

16. The method set forth in claim 15 wherein the additive manufacturing step is a cold spray process.

17. The method set forth in claim 15 wherein the additive manufacturing step is an ultrasonic additive manufacturing process.

18. The method set forth in claim 15 comprising the further step of:
  placing a protective cover over the sensor assembly before the additive manufacturing step.

19. The method set forth in claim 15 comprising the further step of:
  encapsulating a sensor of the sensor assembly in an encapsulation of the sensor assembly before the additive manufacturing step.

20. The component set forth in claim 1, wherein the sensor assembly includes a power harvesting device that provides power through at least one of motion or vibration of the component, and wherein the substrate includes a pocket defined by side walls and the surface as a bottom surface, and wherein the pocket communicates through an outer surface carried by the substrate to receive the sensor assembly and a protective cover, and wherein the protective cover is disposed over the sensor assembly and beneath the additive manufactured layer, and wherein the sensor assembly includes an encapsulation made of epoxy or ceramic, and wherein the encapsulation encapsulates the RF sensor and the EM reflector, and wherein the encapsulation is adhered to the side walls and the bottom surface.

* * * * *